(12) United States Patent
Moon

(10) Patent No.: US 9,362,379 B2
(45) Date of Patent: Jun. 7, 2016

(54) GRAPHENE HETEROSTRUCTURE FIELD EFFECT TRANSISTORS

(71) Applicant: HRL LABORATORIES LLC, Malibu, CA (US)

(72) Inventor: Jeong-Sun Moon, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/684,586

(22) Filed: Apr. 13, 2015

(65) Prior Publication Data

US 2015/0214324 A1  Jul. 30, 2015

Related U.S. Application Data

(62) Division of application No. 14/159,059, filed on Jan. 20, 2014, now Pat. No. 9,064,964.

(60) Provisional application No. 61/767,922, filed on Feb. 22, 2013.

(51) Int. Cl.

| H01L 29/16 | (2006.01) |
|---|---|
| H01L 29/786 | (2006.01) |
| H01L 29/66 | (2006.01) |
| H01L 29/778 | (2006.01) |
| H01L 29/165 | (2006.01) |
| H01L 29/06 | (2006.01) |

(Continued)

(52) U.S. Cl.
CPC ...... *H01L 29/66045* (2013.01); *H01L 29/0657* (2013.01); *H01L 29/1033* (2013.01); *H01L 29/165* (2013.01); *H01L 29/1606* (2013.01); *H01L 29/167* (2013.01); *H01L 29/51* (2013.01); *H01L 29/66431* (2013.01); *H01L 29/66742* (2013.01); *H01L 29/66977* (2013.01); *H01L 29/778* (2013.01); *H01L 29/78618* (2013.01); *H01L 29/78684* (2013.01); *H01L 29/78696* (2013.01); *H01L 29/45* (2013.01)

(58) Field of Classification Search
USPC .................................................. 438/151–154
See application file for complete search history.

(56) References Cited

U.S. PATENT DOCUMENTS

| 9,184,266 B2 * | 11/2015 | Kub ...................... B82Y 10/00 |
| 2011/0303121 A1 | 12/2011 | Geim et al. |

(Continued)

FOREIGN PATENT DOCUMENTS

| KR | 10-2012-0068390 | 6/2012 |
| KR | 10-2012-0136118 | 12/2012 |
| WO | 2012/051597 A2 | 4/2012 |

OTHER PUBLICATIONS

Office Action Dated Dec. 5, 2014 for Related U.S. Appl. No. 14/159,059.

(Continued)

*Primary Examiner* — Cuong Q Nguyen
(74) *Attorney, Agent, or Firm* — Ladas & Parry

(57) ABSTRACT

A field effect transistor includes a substrate, a first graphene (Gr) layer on the substrate, a second graphene (Gr) layer on the substrate, a fluorographene (GrF) layer on the substrate and between the first and second graphene layers, a first ohmic contact on the first graphene layer, a second ohmic contact on the second graphene layer, a gate aligned over the fluorographene layer, and a gate dielectric between the gate and the fluorographene layer and between the gate and the first and second ohmic contacts.

8 Claims, 6 Drawing Sheets

(51) Int. Cl.
  *H01L 29/10* (2006.01)
  *H01L 29/167* (2006.01)
  *H01L 29/51* (2006.01)
  *H01L 29/45* (2006.01)

(56) References Cited

U.S. PATENT DOCUMENTS

2012/0085991 A1   4/2012   Cohen et al.
2015/0349061 A1*  12/2015  Davis ............... H01L 21/0237
                                                      438/479

OTHER PUBLICATIONS

Office Action Dated Feb. 27, 2015 for Related U.S. Appl. No. 14/159,059.

International Preliminary Report on Patentability (Chapter II) From PCT/US2014/012218 Mailed on Jan. 20, 2015.
International Search Report and Written Opinion for PCT/US2014/012218 mailed on May 12, 2014.
L. Britnell et al., "Field-Effect Tunneling Transistor Based on Vertical Graphene Heterostructures", Science, vol. 335, pp. 947-949, Feb. 24, 2012.
H. Yang, J. Heo, S. Park, H.J. Song, K.E. Byun, P. Kim, I. Yoo, H.J. Chung, and K. Kim, "Graphene Barristor, A Triode Device With a Gate-Controlled Schottky Barrier", Science, vol. 336, No. 6085, pp. 1140-1143, Jun. 1, 2012.
W. Mehr, J. Dabrowski, J.C. Scheytt, G. Lippert, Y.-H Xie, M.C. Lemme, M. Ostling, and G. Lupina, "Vertical Graphene Base Transistor", IEEE Electron Dev. Lett., vol. 33, pp. 691-693, No. 5, May 5, 2012.

* cited by examiner

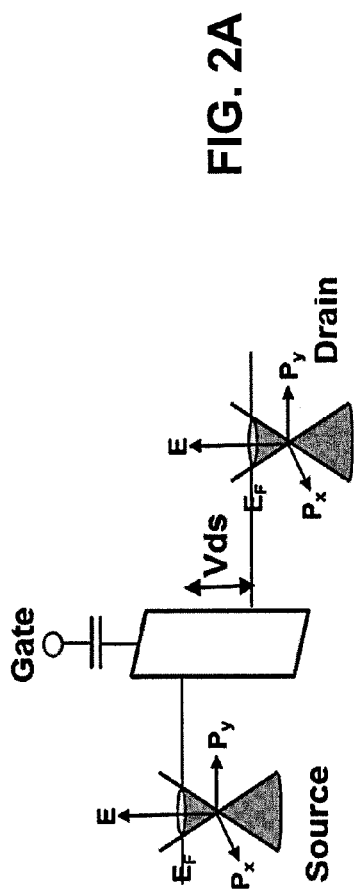
FIG. 2A
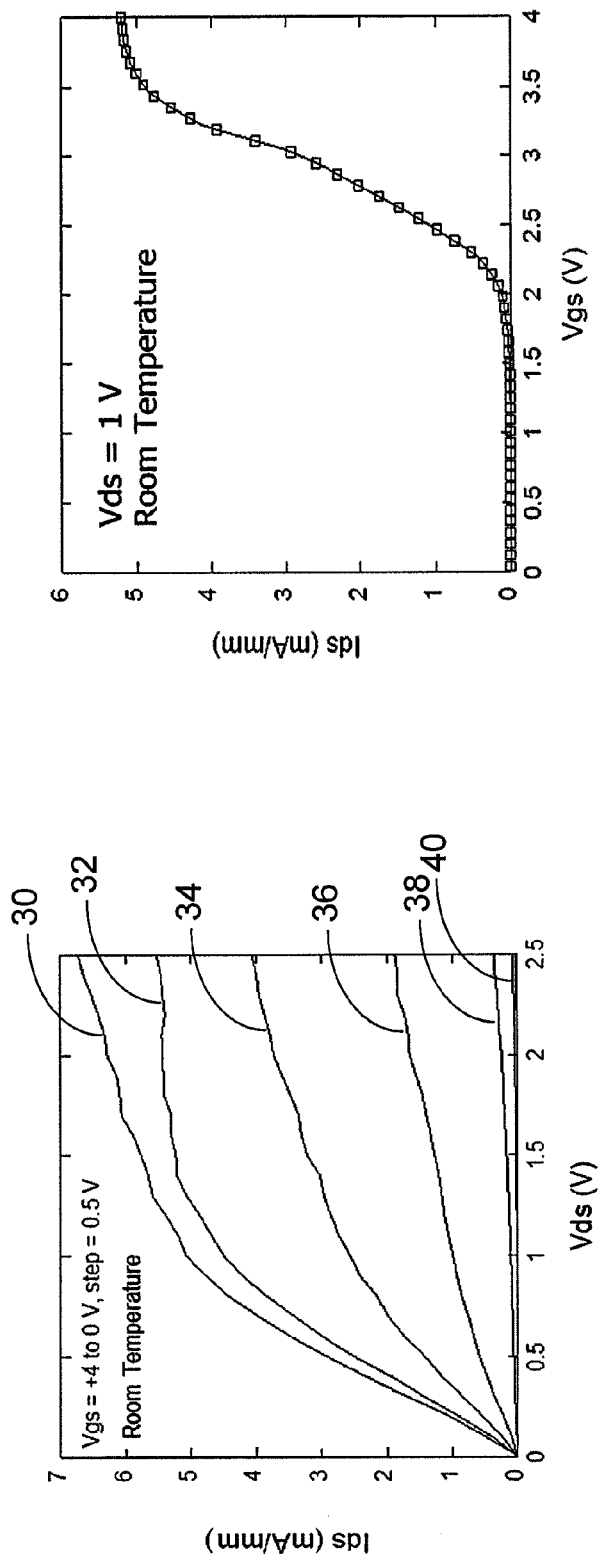
FIG. 2C
FIG. 2B

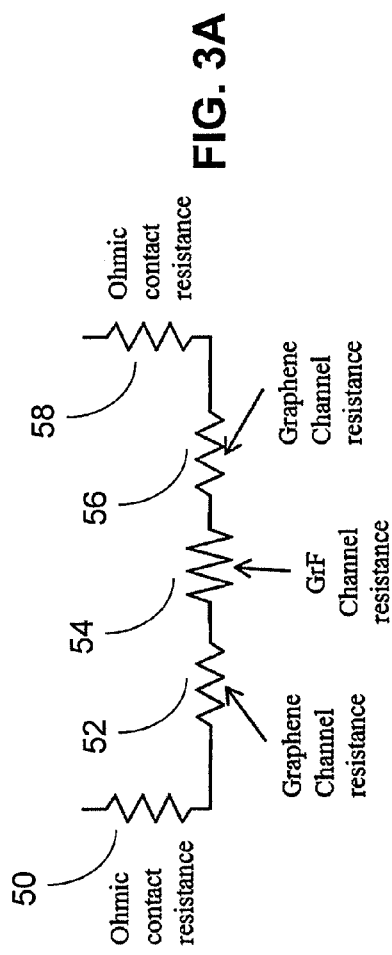
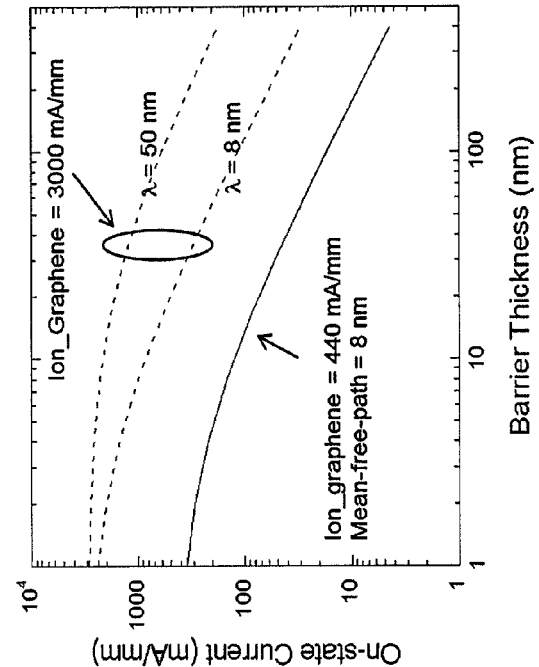
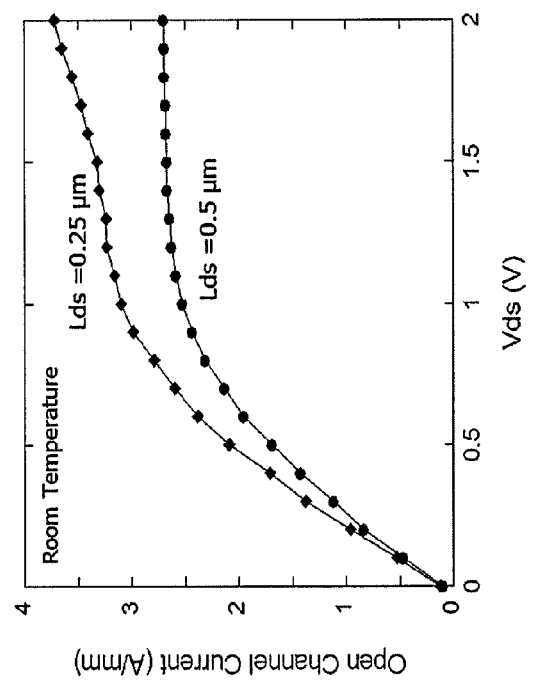
FIG. 3A
FIG. 3B
FIG. 3C

GRAPHENE HETEROSTRUCTURE FIELD EFFECT TRANSISTORS

CROSS REFERENCE TO RELATED APPLICATION

This application is a divisional of U.S. patent application Ser. No. 14/159,059 filed on Jan. 20, 2014, which claims the benefit of U.S. Provisional Application No. 61/767,922, filed on Feb. 22, 2013, which are incorporated herein as though set forth in full.

TECHNICAL FIELD

This disclosure relates to graphene transistors.

BACKGROUND

Several alternative forms of graphene transistors have been described utilizing wideband gap materials.

L. Britnell et al., "Field-effect Tunneling transistor based on vertical graphene heterostructures", Science, vol. 335, p. 947, 2012 describe utilizing hexagonal boron nitride (h-BN) or $MoS_2$ as a wideband gap tunnel barrier for both vertical geometry field effect transistors (FETs) and vertical graphene heterostructure tunnel field effect transistors (FETs). The vertical geometry field effect transistors (FETs) demonstrated an on/off ratio of ~50 (h-BN). The vertical graphene heterostructure tunnel field effect transistors (FETs) demonstrated an on/off ratio of ~$10^4$ ($MoS_2$).

H. Yang, J. Heo, S. Park, H. J. Song, D. H. Seo, K. E. Byun, P. Kim, I. Yoo, H. J. Chung, and K. Kim, "Graphene Barristor, a triode device with a gate-controlled Schottky barrier", Science, vol. 336, p. 6085, 2012 describe graphene/Si vertical barristors with gate control of the graphene/Si Schottky barrier height.

W. Mehr, J. Dabrowski, J. C. Scheytt, G. Lippert, Y.-H. Xie, M. C. Lemme, M. Ostling, and G. Lupina, "Vertical Graphene Base Transistor", IEEE Electron Dev. Lett., vol. 33, pp. 691, 2012 describe a vertical graphene base transistor.

What is needed are improved graphene transistors. The embodiments of the present disclosure answer these and other needs.

SUMMARY

In a first embodiment disclosed herein, a field effect transistor comprises a substrate, a first graphene (Gr) layer on the substrate, a second graphene (Gr) layer on the substrate, a fluorographene (GrF) layer on the substrate and between the first and second graphene layers, a first ohmic contact on the first graphene layer, a second ohmic contact on the second graphene layer, a gate aligned over the fluorographene layer, and a gate dielectric between the gate and the fluorographene layer and between the gate and the first and second ohmic contacts.

In another embodiment disclosed herein, an integrated circuit comprises a substrate, a first heterostructure field effect transistor comprising a first graphene (Gr) layer on the substrate, a second graphene (Gr) layer on the substrate, a first fluorographene (GrF) layer on the substrate and between the first and second graphene layers, a first ohmic contact on the first graphene layer, a second ohmic contact on the second graphene layer, a first gate aligned over the first fluorographene layer, and a first gate dielectric between the first gate and the first fluorographene layer and between the first gate and the first and second ohmic contacts, wherein the first and second graphene (Gr) layers are n-type, and the first and second ohmic contacts are n-type, and a second heterostructure field effect transistor comprising a third graphene (Gr) layer on the substrate, a fourth graphene (Gr) layer on the substrate, a second fluorographene (GrF) layer on the substrate and between the third and fourth graphene layers, a third ohmic contact on the third graphene layer, a fourth ohmic contact on the fourth graphene layer, a second gate aligned over the second fluorographene layer, and a second gate dielectric between the second gate and the second fluorographene layer and between the second gate and the third and fourth ohmic contacts, wherein the first and second graphene (Gr) layers are n-type, and the first and second ohmic contacts are n-type.

In still another embodiment disclosed herein, a method of fabricating a heterostructure FET comprises forming graphene on a substrate, forming a graphene mesa by dry etching, forming a first ohmic contact for a source on one end of the graphene mesa, forming a second ohmic contact for a drain on an opposite end of the graphene mesa, forming an opening by masking and etching to expose a portion of the graphene between the first and second ohmic contacts, doping an exposed portion of the graphene with Fluorine, annealing to reduce defects, depositing a gate dielectric over the opening, and forming a gate over the gate dielectric.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 2A shows a band alignment diagram at finite source-drain bias for a Gr/GrF/Gr FET in accordance with the present disclosure;

FIG. 2B shows a measured direct current (DC) source-drain current-voltage characteristic graph in accordance with the present disclosure;

FIG. 2C shows a current transfer curve graph as a function of gate voltage at room temperature in accordance with the present disclosure;

FIG. 3A shows an equivalent circuit for a graphene HFET as a series resistor network in accordance with the present disclosure;

FIG. 3B shows a channel current vs. Vds graph at room temperature for Lds=0.25 μm and Lds=0.5 μm, respectively, in accordance with the present disclosure;

FIG. 3C shows a graph of the calculated on-state current with respect to GrF barrier thickness in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1A:
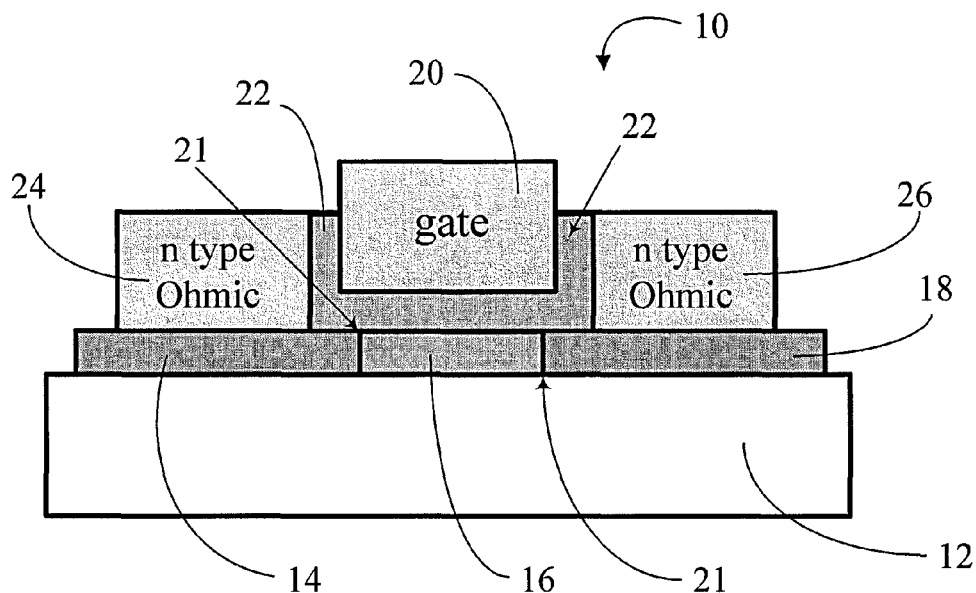
FIG. 1A shows a diagram of an n-type graphene (Gr), fluorographene (GrF), and graphene (Gr) heterostructure FET (HFET) in accordance with the present disclosure.

Referring now to FIG. 1A a lateral graphene HFET 10 is shown that has a lateral graphene heterostructure channel, which has a graphene (Gr) layer 14, a fluorographene (GrF) layer 16, and a graphene (Gr) layer 18 arranged laterally on a substrate 12, which may be Si, $SiO_2$, SiC, glass, or pyrex among other suitable substrate materials. The fluorographene (GrF) layer 16 is between the graphene (Gr) layer 14 and the the graphene (Gr) layer 18. Ohmic contacts 24 and 26 are on the graphene (Gr) layer 14 and graphene (Gr) layer 18, respectively, for source and drain contacts. A gate 20, which may be any metal, such as gold, is aligned with the fluorographene (GrF) layer 16 and insulated from the fluorographene (GrF) layer 16 by gate dielectric layer 22, which may be silicon nitride (SiN), silicon dioxide ($SiO_2$), Boron Nitride (BN), aluminum oxide ($Al_2O_3$), or hafnium oxide ($HfO_2$), among other suitable insulators. As shown in FIG. 1A, the gate 20 is aligned with the fluorographene (GrF) layer 16 and the gate 20 has dimensions such that the gate 20 overlaps the fluorographene (GrF) layer 16 arranged laterally between the graphene (Gr) layer 14 and the graphene (Gr) layer 18. The edges 21 on either side of the fluorographene (GrF) layer 16 are under and overlapped by gate 20. In order to overlap the fluorographene (GrF) layer 16, the gate 20 has a greater lateral dimension than the fluorographene (GrF) layer 16.

The GrF 16 is a wide bandgap material, providing a potential barrier to carrier transport between the graphene (Gr) layer 14 and the graphene (Gr) layer 18. The potential barrier of the GrF 16 is a function of the bias on gate 20. With no gate 20 bias, the graphene HFET 10 is normally-off.

Figure 1B:
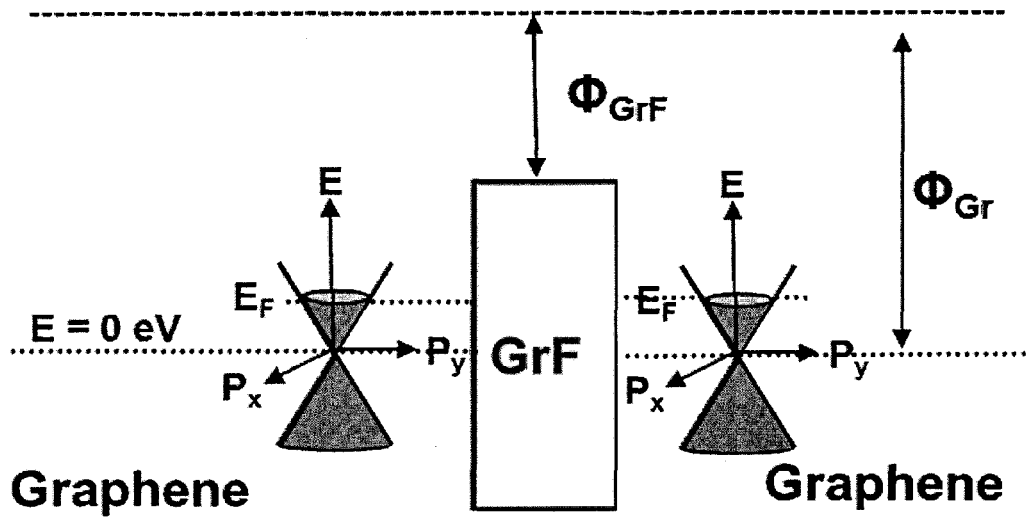
FIG. 1B shows a band alignment diagram at zero source-drain bias for a Gr/GrF/Gr FET in accordance with the present disclosure.

FIG. 1B shows a schematic sketch of the band alignment at zero source-drain bias for the graphene (Gr) 14, fluorographene (GrF) 16, and graphene (Gr) 18 HFET 10. The conduction and valence band offsets are defined by a work function difference $\Delta\Phi = \Phi_{Gr} - \Phi_{GrF}$. FIG. 2A shows a simplified schematic sketch of the Gr/GrF/Gr band alignment at a finite source-drain bias.

Figure 1C:
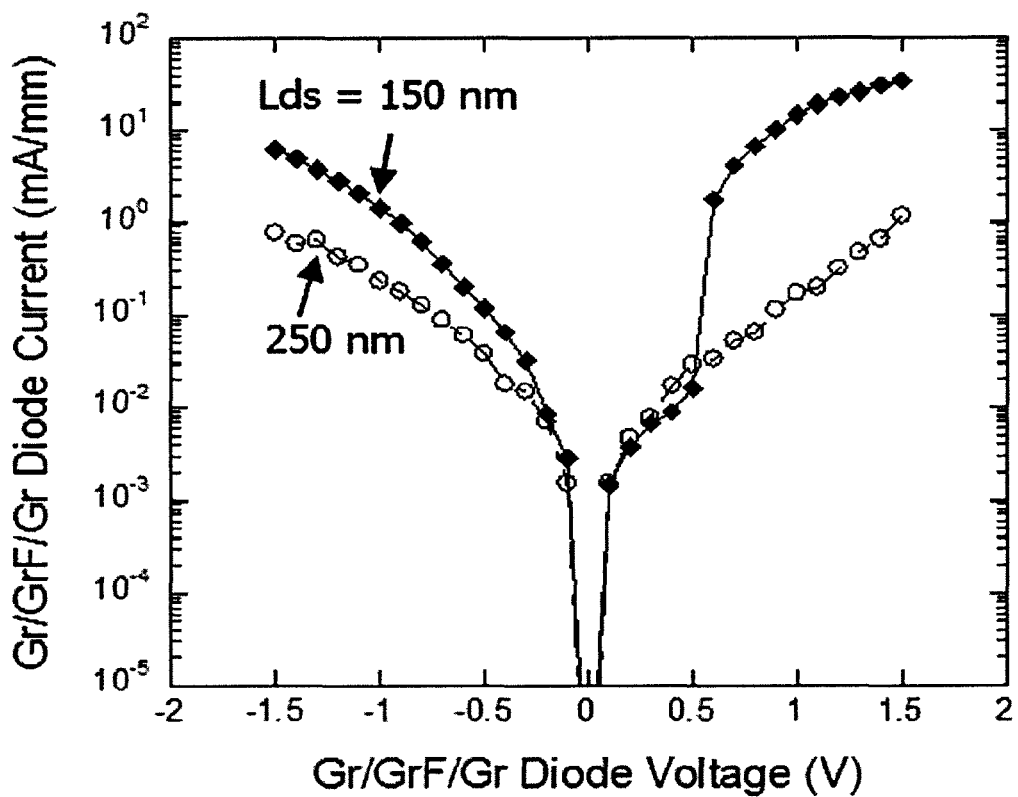
FIG. 1C shows a graph of a measured Gr/GrF/Gr diode current vs. diode voltage for two different devices with source-drain spacing of 150 nm and 250 nm, respectively, in accordance with the present disclosure.

The current vs. voltage characteristics were measured for lateral Gr/GrF/Gr diodes with lateral channel lengths (Lds) of 150 nm and 250 nm, as shown in FIG. 1C. The diodes showed highly nonlinear I-V curves with turn-on characteristics that indicate the formation of a potential barrier in the GrF layer 16 in the channel.

Figure 1D:
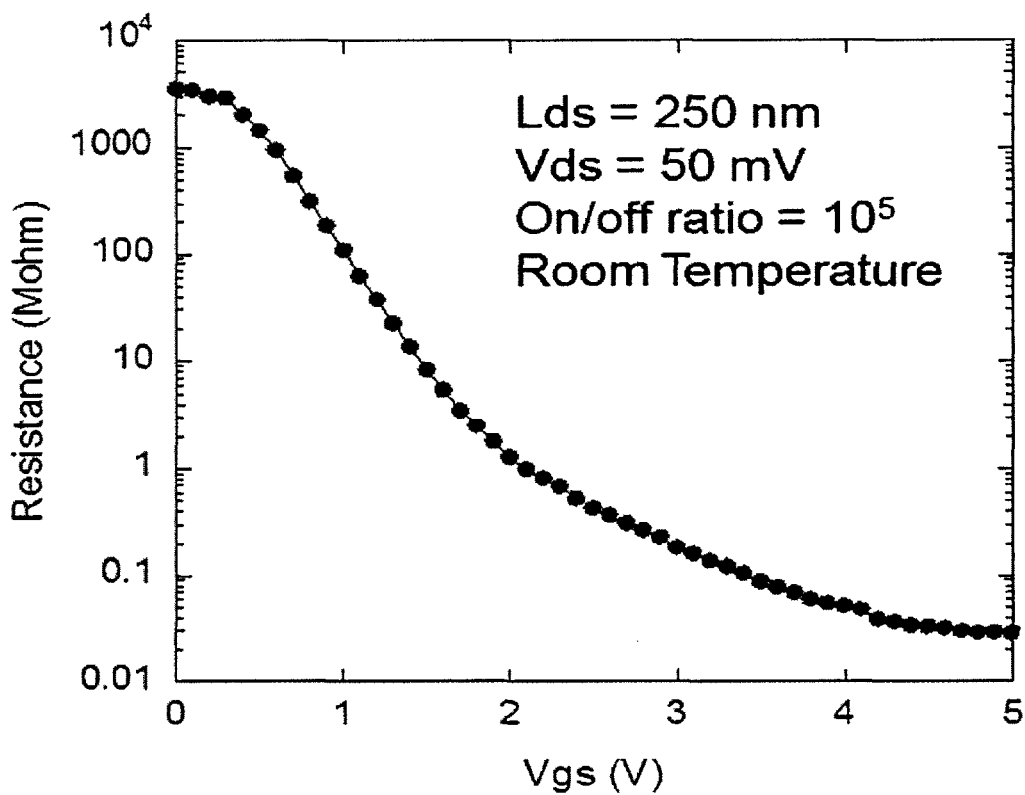
FIG. 1D shows a graph of a measured graphene HFET channel resistance as a function of gate voltage in accordance with the present disclosure.

FIG. 1D shows a graph of measured graphene HFET channel resistance as a function of gate voltage Vgs, which shows the Gr 14/GrF 16/Gr 18 channel resistance varying from 3 GΩ to 30 kΩ, which is an on-off resistance ratio of $10^5$, at room temperature with a gate bias applied from 0 V to +5 V. By contrast, the on-off resistance ratio due to modulation of a graphene only channel is less than 10.

Lateral graphene HFETs according to the present disclosure have a stable operation up to 100° C.

The heterostructure graphene HFET 10, as shown in FIG. 1A, is an n-type graphene HFET. In an n-type graphene HFET, the graphene (Gr) 14 and the graphene (Gr) 18 are n-type, and the ohmic contacts 24 and 26 are n type ohmic contacts, which may be titanium (Ti) based.

The heterostructure graphene HFETs were characterized at room temperature in terms of direct current (DC) source-drain current-voltage characteristics and transfer curves, as shown in FIGS. 2B and 2C. As shown in FIGS. 2B and 2C, current pinch-off is observed until the gate is biased to a sufficient positive voltage. The off-state current (Ioff) was measured to be 0.7 µA/mm at Vds=1 V and Vgs=0 V, which shows that lateral graphene HFETS have a normally-off and enhancement-mode operation as a consequence of the GrF barrier 16 in the channel. For Vgs>2 V, the graphene HFETs turned-on and a saturated on-state current (Ion) of 5.2 mA/mm for Vds=1 V was measured. The resulting Ion/Ioff ratio at Vds=1 V was measured to be 7,000. The measured I-V curves, as shown in FIG. 2B, also show excellent saturation behavior of the source-drain current. FIG. 2B shows I-V curves for Vgs=+4V, reference 30; Vgs=+3.5V, reference 32; Vgs=+3V, reference 34; Vgs=+2.5V, reference 36; Vgs=+2V, reference 38; and Vgs=0-2V, reference 40.

FIG. 3A shows an equivalent circuit for a graphene HFET as series resistor network, showing ohmic contact 24 resistance 50, graphene layer 14 resistance 52, GrF 16 resistance 54, graphene layer 18 resistance 56, and ohmic contact 26 resistance 58.

FIG. 3B shows a graph of the channel current versus Vds at room temperature for channel length Lds=0.25 µm and Lds=0.5 µm, respectively. The channel current density is 2.5 A/mm for Lds=0.5 µm and 3.1 A/mm for Lds=0.25 µm at Vds=1 V, as shown in FIG. 3B.

FIG. 3C is a graph of on-state current with respect to the GrF 16 barrier thickness. FIG. 3C shows a calculated on-state current density for Gr/GrF/Gr FETs with two different mean free paths of 8 nm and 50 nm, with the current density of 3.0 A/mm as $I_{ballistic}$. In the case of λ=50 nm, 1000 mA/mm of on-state current can be achieved with ~50 nm of GrF barrier thickness.

Figure 4A:
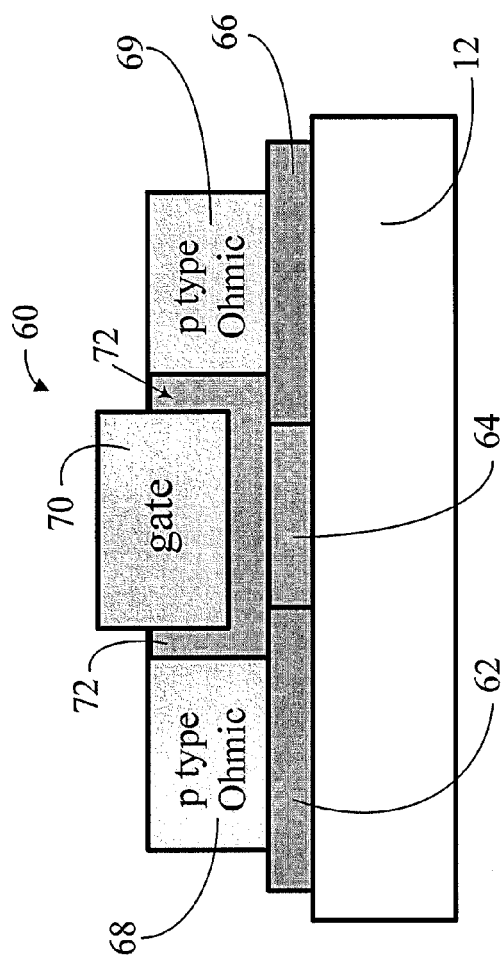
FIG. 4A shows a diagram of a p-type Gr/GrF/Gr HFET in accordance with the present disclosure.

A heterostructure graphene HFET 60, as shown in FIG. 4A, may be a p-type graphene HFET. In a p-type graphene HFET 60, the lateral graphene heterostructure channel has a p-type graphene (Gr) layer 62, a fluorographene (GrF) layer 64, and a p-type graphene (Gr) layer 66 arranged laterally on a substrate 12. Ohmic contacts 68 and 69 are on the graphene (Gr) layer 62 and graphene (Gr) layer 66, respectively, for source and drain contacts. The ohmic contacts 68 and 69 are p type ohmic contacts and may be palladium (Pd) based. A gate 70 is aligned with the fluorographene (GrF) layer 64 and insulated from the fluorographene (GrF) layer 64 by gate dielectric layer 72. As shown in FIG. 4A, the gate 70 is aligned with the fluorographene (GrF) layer 64 and the gate 70 has dimensions such that the gate 70 overlaps the fluorographene (GrF) layer 64 arranged laterally between the graphene (Gr) layer 62 and the graphene (Gr) layer 66. In order to overlap the fluorographene (GrF) layer 64, the gate 70 has a greater lateral dimension than the fluorographene (GrF) layer 64.

Figure 4B:
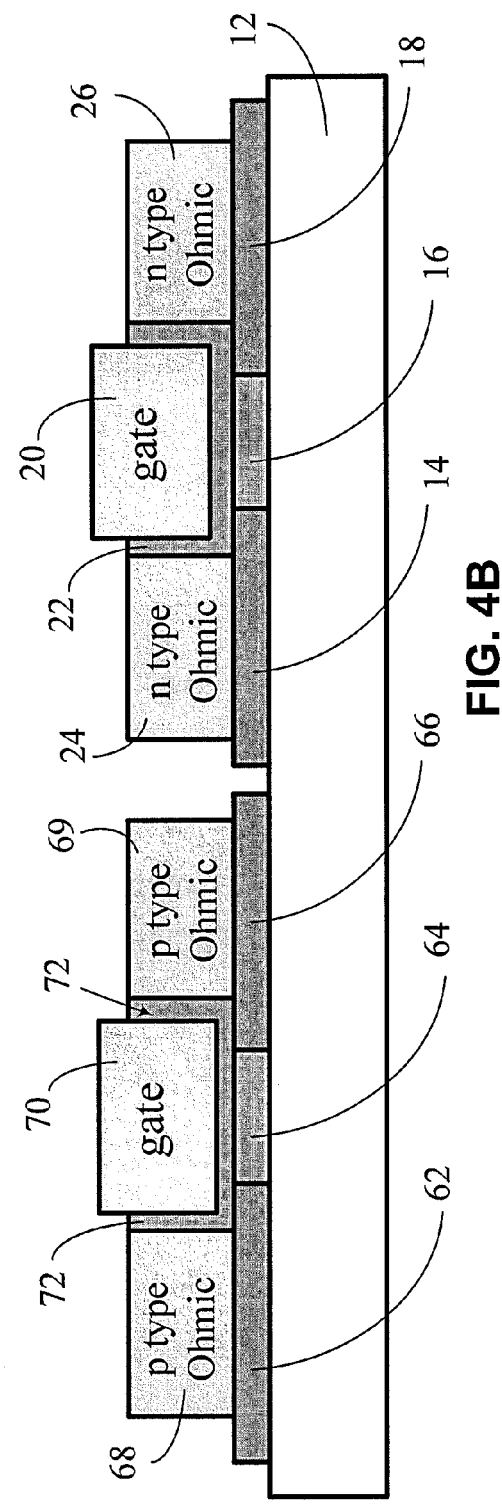
FIG. 4B shows integration of n- and p-type graphene HFETs on a common substrate in accordance with the present disclosure.

The n-type graphene HFET 10, shown in FIG. 1A, and the p-type graphene HFET 60, shown in FIG. 4A, may be integrated on a common substrate 12, as shown in FIG. 4B.

Figure 5:
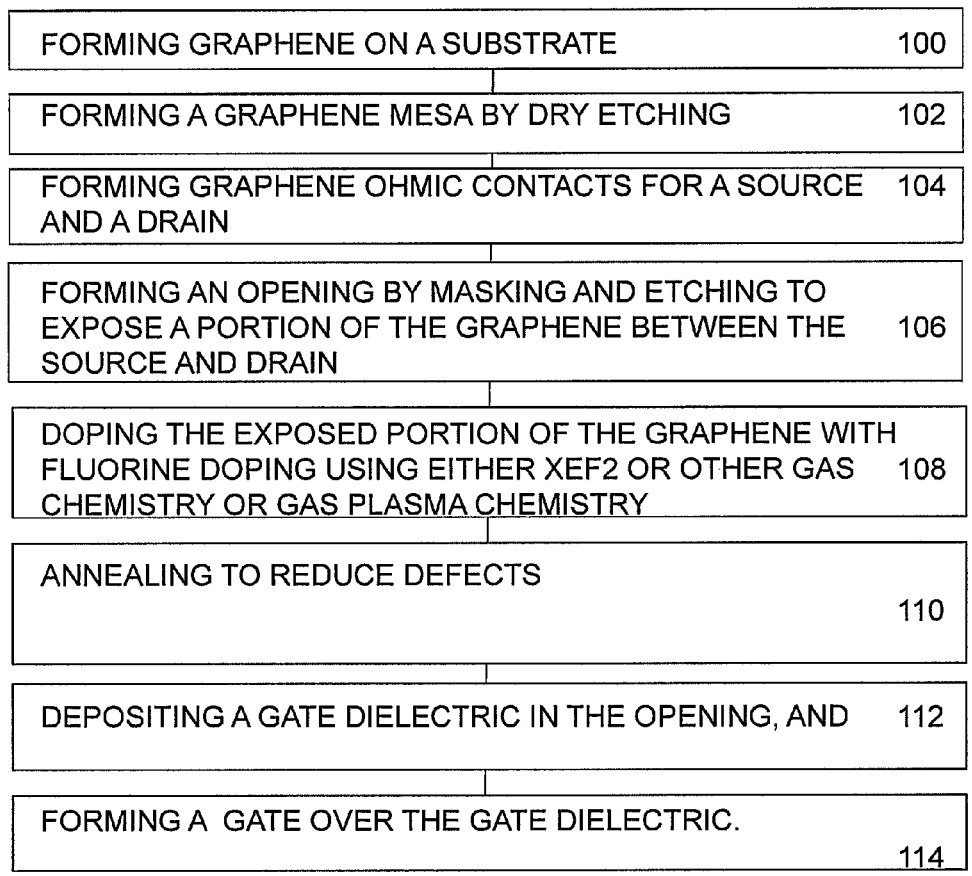
FIG. 5 shows a method of fabricating a lateral graphene heterostructure FET in accordance with the present disclosure.

As shown in the flow diagram of FIG. 5, a method of fabricating a lateral graphene heterostructure FET includes the following steps: in step 100 forming graphene on a substrate by chemical vapor deposition (CVD) or epitaxial processes, in step 102 forming a graphene mesa by dry etching, in step 104 forming ohmic contacts on opposite ends of the graphene mesa for source and drain contact. The ohmic contacts may be either n-type or p-type, in step 106 forming an opening by masking and etching to expose a portion of the graphene between the source and drain, in step 108 doping the exposed portion of the graphene with Fluorine doping using either XeF2 or other gas chemistry or gas plasma chemistry, in step 110 annealing to reduce defects, in step 112 depositing a gate dielectric in the opening, and in step 114 forming a metal gate over the gate dielectric. This can be followed by a metal2 layer process to connect with other circuitry.

The step of forming graphene on a substrate or wafer may be use normal by epitaxial processes. Alternatively, the step of forming graphene on a substrate or wafer may be performed by using chemical vapor deposition (CVD) to deposit a graphene layer on a metal foil and then transferring the graphene layer to a substrate.

As discussed above, the substrate 12 may be Si, $SiO_2$, SiC, glass, or pyrex among other suitable substrate materials. The fluorographene (GrF) layer 16 formed between the graphene (Gr) layer 14 and the graphene (Gr) layer 18. The ohmic contacts 24 and 26 are formed on the graphene (Gr) layer 14 and graphene (Gr) layer 18, respectively, for source and drain contacts. The gate 20 is aligned with the fluorographene (GrF) layer 16 and insulated from the fluorographene (GrF) layer 16 by gate dielectric layer 22, which may be silicon nitride (SiN), silicon dioxide ($SiO_2$), Boron Nitride (BN), aluminum oxide ($Al_2O_3$), or hafnium oxide ($HfO_2$), among other suitable insulators.

In an n-type graphene HFET, the graphene (Gr) 14 and the graphene (Gr) 18 are n-type, and the ohmic contacts 24 and 26 are n type ohmic contacts, which may be titanium (Ti) based. In a p-type graphene HFET 60, the lateral graphene heterostructure channel has a p-type graphene (Gr) layer 62 and a p-type graphene (Gr) layer 66, and the ohmic contacts 68 and 69 are p type ohmic contacts and may be palladium (Pd) based.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of fabricating a heterostructure FET comprises:
   forming graphene on a substrate;
   forming a graphene mesa by dry etching;
   forming a first ohmic contact for a source on one end of the graphene mesa;
   forming a second ohmic contact for a drain on an opposite end of the graphene mesa;
   forming an opening by masking and etching to expose a portion of the graphene between the first and second ohmic contacts;
   doping an exposed portion of the graphene with Fluorine;
   annealing to reduce defects;
   depositing a gate dielectric over the opening; and
   forming a gate over the gate dielectric.

2. The method of claim 1 wherein forming graphene on a substrate comprises epitaxial processes to form graphene on the substrate, or using chemical vapor deposition (CVD) to deposit the graphene layer on a metal foil and then transferring the graphene layer to the substrate.

3. The method of claim 1 wherein doping the exposed portion of the graphene with Fluorine doping comprises using XeF2 or other gas chemistry or gas plasma chemistry.

4. The method of claim 1 wherein:
   the graphene is n-type; and
   the first and second ohmic contacts are n-type.

5. The method of claim 1 wherein:
   the graphene is p-type; and
   the first and second ohmic contacts are p-type.

6. The method of claim 1 wherein the substrate comprises Si, $SiO_2$, SiC, glass, or pyrex.

7. The method of claim 1 wherein the gate dielectric layer comprises silicon nitride (SiN), silicon dioxide ($SiO_2$), Boron Nitride (BN), aluminum oxide ($Al_2O_3$), or hafnium oxide ($HfO_2$).

8. The method of claim 1 wherein the gate is formed to overlap the portion of the graphene doped with Fluorine.

* * * * *